(12) United States Patent
Kaneko (10) Patent No.: US 6,249,188 B1
(45) Date of Patent: Jun. 19, 2001

(54) ERROR-SUPPRESSING PHASE COMPARATOR

(75) Inventor: Yoshiaki Kaneko, Yamanashi-ken (JP)

(73) Assignee: Fijitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/528,998

(22) Filed: Mar. 20, 2000

(30) Foreign Application Priority Data

Mar. 19, 1999 (JP) ................................... 11-076010

(51) Int. Cl.[7] .......................... H03L 7/085; H03L 7/089; H03L 7/095; G01R 25/00; H03D 13/00
(52) U.S. Cl. ............................. 331/17; 331/1 A; 331/14; 331/25; 331/DIG. 2; 327/12; 327/7; 327/156; 327/159
(58) Field of Search ................................. 331/1 A, 8, 14, 331/17, 25, DIG. 2; 327/2, 3, 5, 7–10, 12, 156–159

(56) References Cited

U.S. PATENT DOCUMENTS

| | | | |
|---|---|---|---|
| 5,297,173 | * | 3/1994 | Hikmet et al. ........................ 375/118 |
| 5,619,148 | * | 4/1997 | Guo ........................................ 327/3 |
| 5,789,947 | * | 8/1998 | Sato ........................................ 327/3 |

FOREIGN PATENT DOCUMENTS 10-163757   6/1998   (JP) .

* cited by examiner

Primary Examiner—David Mis
(74) Attorney, Agent, or Firm—Arent Fox Kintner Plotkin & Kahn, PLLC (57) ABSTRACT

Provided are a phase comparator (BBD) 10 for generating a pulse of a signal UP0 or DOWN0 depending on lead or lag of the falling edge of a clock recovered from DATA, relative to the edge of DATA, an overrun detector circuit 20 activating an overrun signal OVR while the circuit 20 detects that lead or lag of the falling edge of the clock exceeds $\pi/2$, a state latch circuit 30 latching a state of either a signal UP0 or DOWN0 being active before the signal OVR transits active, and a selection circuit 40 outputting the signals UP0 and DOWN0 as signals UP and DOWN while the signal OVR is inactive, and outputting the signals UP0 and DOWN0 as the signals DOWN and UP while the signal OVR is active.

10 Claims, 9 Drawing Sheets

ERROR-SUPPRESSING PHASE COMPARATOR

BACKGROUND OF THE INVENTION

1. Field of the Invention

The present invention relates to an error-suppressing phase comparator which has a function of effectively reducing a phase error, for use particularly in a PLL circuit.

2. Description of the Related Art

Figure 6:
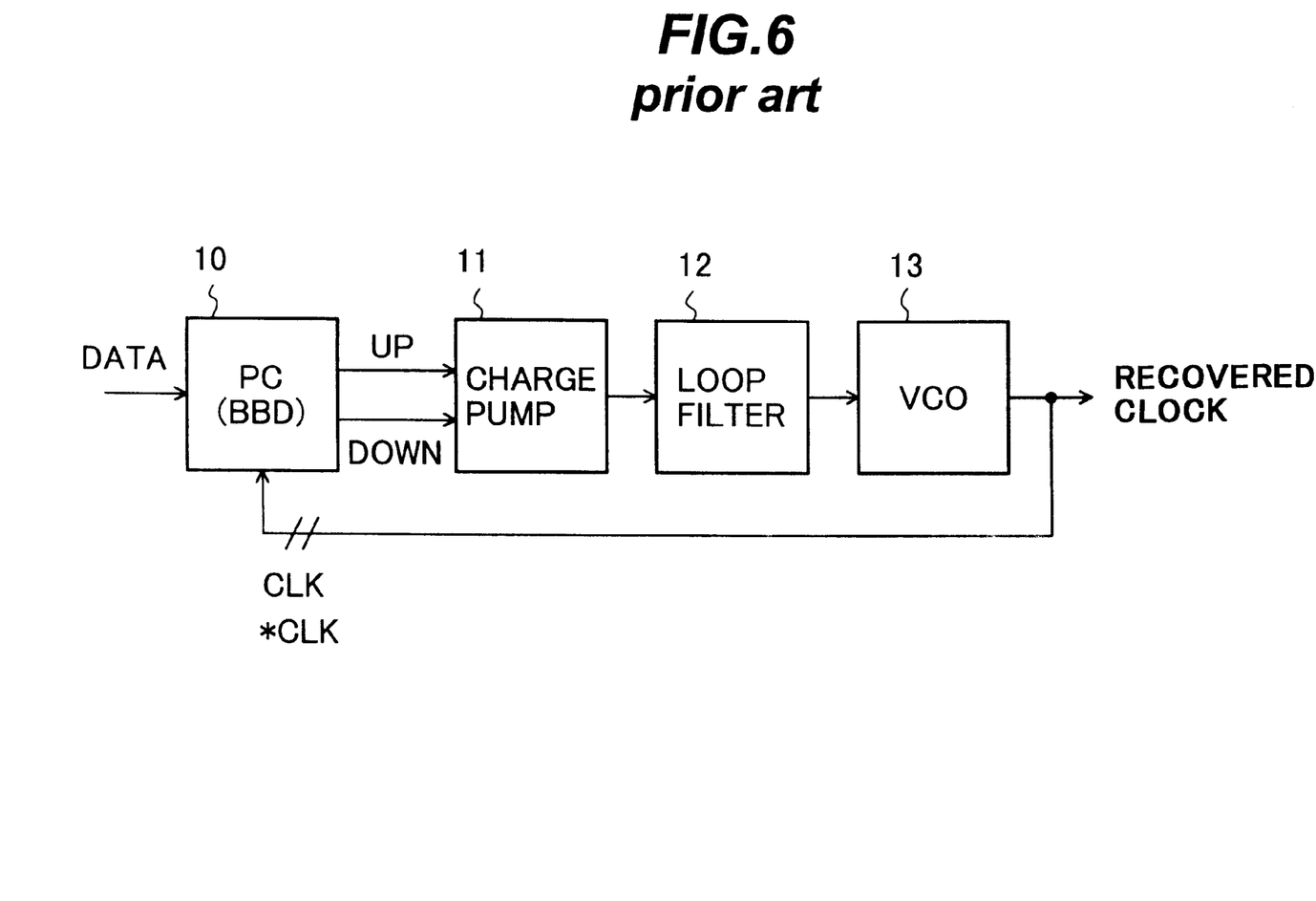
FIG. 6 is a block diagram showing a prior art PLL circuit.

FIG. 6 shows a prior art PLL circuit using a phase comparator 10.

Received serial data DATA is a signal generated in synchronization with a reference clock on the transmission side. The reference clock is produced by a crystal oscillator, and its frequency changes within the maximum of about ±/100 PPM due to variations in temperature. Since the frequency fr of the reference clock is of a high value in the range of, for example, 500 MHz to 3 GHz, the value of the maximum variations is large and extends from ±/500 Hz to ±/3 MHz. Hence, using the PLL circuit as shown in FIG. 6, a clock signal CLK is recovered from the received serial data DATA.

When an edge of the recovered clock CLK leads an edge of DATA, the phase comparator 10 outputs a pulse of a down signal DOWN in order to delay the lead, while in the reverse situation, the phase comparator 10 outputs a pulse of an up signal UP. A charge pump 11 provides a pulse of a current signal depending on a pulse of the signal UP or DOWN. A loop filter 12 smoothes the current signal from the charge pump 11, namely, filters out high frequency components to get a smoothed voltage signal, and the voltage signal is in turn applied to a voltage controlled oscillator (VCO) 13. The VCO 13 generates clocks CLK and *CLK which are complementary to each other and whose frequency fc is in a linear relation with an input voltage thereto, and provides the clocks CLK and *CLK to the phase comparator 10.

Figure 7:
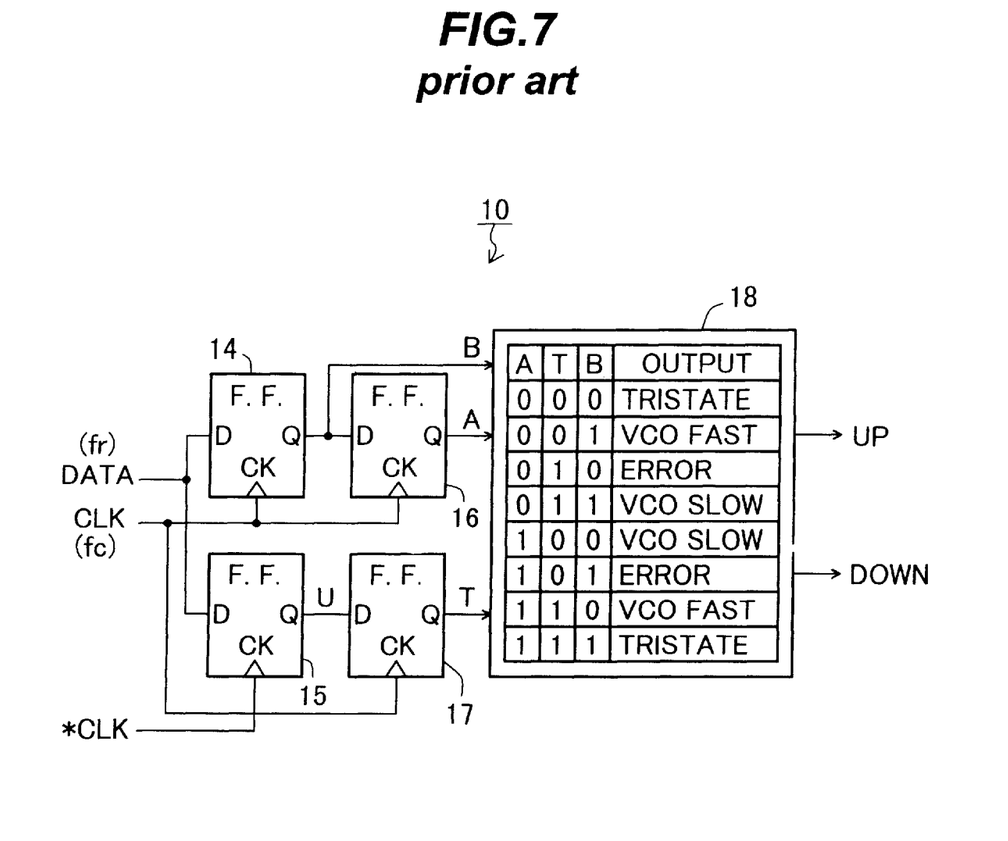
FIG. 7 is a block diagram showing a configuration of the phase comparator of FIG. 6.

FIG. 7 shows the configuration of a prior art phase comparator 10.

D flip-flops 14 and 15 latch DATA in response to rises of the recovered clocks CLK and *CLK and output data as B and U, respectively. D flip-flops 16 and 17 latch the B and U in response to the rise of the recovered clock CLK and output data as A and T, respectively. A determination circuit 18 is a combinational logic circuit and determines binary levels of the signals UP and DOWN depending on the values of A, T and B. The phase comparator with such a configuration is called a Bang Bang phase detector circuit (BBD).

Figure 8A:
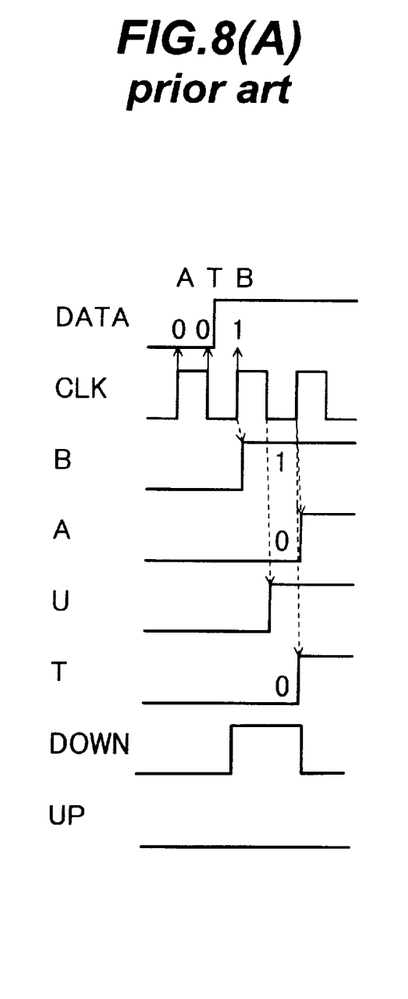
FIGS. 8(A) and 8(B) are timing charts showing operations of the phase comparator of FIG. 7 in cases where the falling edge of a recovered clock leads and lags the rising edge of DATA, respectively.
Figure 8B:
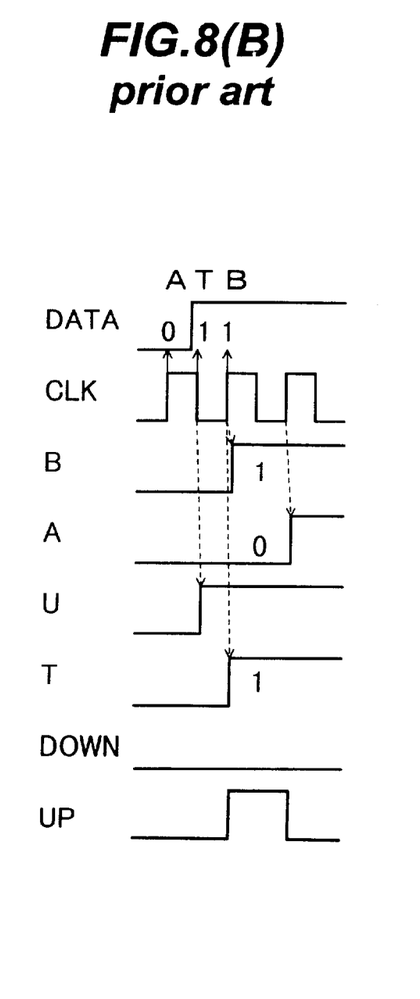
Figure 9A:
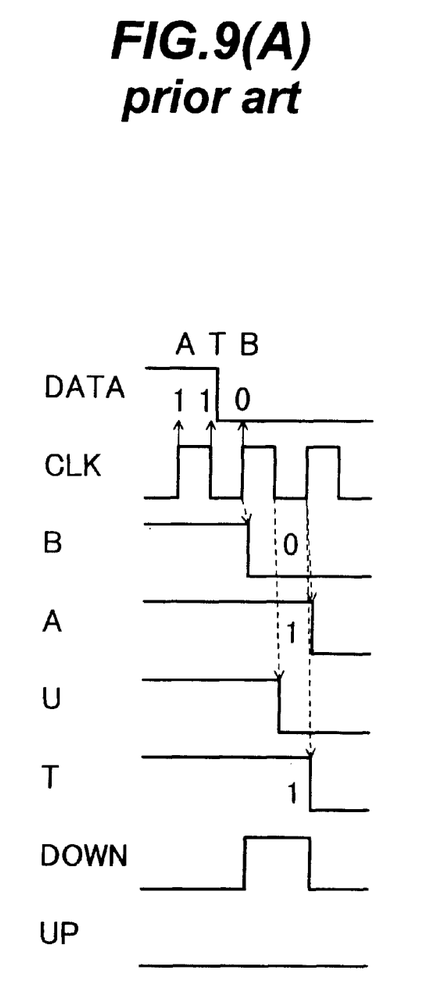
FIGS. 9(A) and 9(B) are timing charts showing operations of the phase comparator of FIG. 7 in cases where the falling edge of the recovered clock leads and lags the falling edge of DATA, respectively.
Figure 9B:
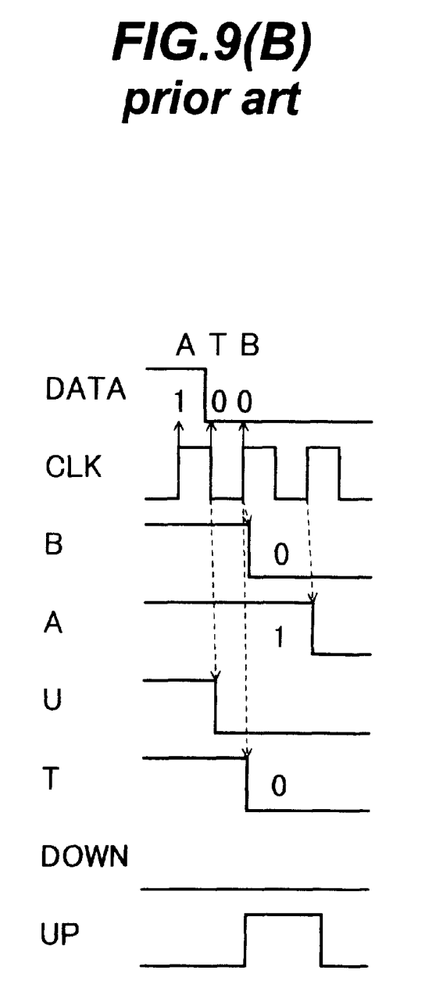

FIGS. 8(A) and 8(B) are timing charts showing cases where the falling edge of the recovered clock CLK leads and lags the rising edge of DATA, respectively. FIGS. 9(A) and 9(B) are timing charts showing cases where the falling edge of the recovered clock CLK leads and lags the falling edge of DATA, respectively.

A, T and B respectively correspond to the values of DATA at three consecutive edges of the recovered clock CLK as shown in those figures. That is, T corresponds to the value of DATA on the falling edge of the CLK within $-\pi$ to $\pi$ relative to the edge of DATA, and A and B respectively correspond to the values of DATA on the preceding and succeeding rising edges of the CLK from that edge of DATA.

In a case where (A, T, B)=('0', '0', '1') as shown in FIG. 8(A), since the falling edge of the recovered clock CLK leads the rising edge of DATA, a pulse of the signal DOWN is generated in order to delay the lead. In FIG. 7, it means that in cases of TRISTATE where A, T and B are all '0' or '1,' a lead or lag of phase cannot be determined. VCO FAST indicates that the falling edge of the recovered clock leads the edge of DATA, which corresponds to a pulse of the signal DOWN. VCO SLOW indicates that the falling edge of the recovered clock lags the edge of DATA, which corresponds to a pulse of the signal UP. ERROR is a state that does not arises in the normal operation.

Since the phase comparator 10 of FIG. 7 detects only lead or lag of phase, in a case where the phase comparator 10 of FIG. 7 is employed in a PLL circuit, there is not sufficient follow-up control of the recovered clock to a reference clock. That is, if DATA are a number of '0s' or '1s' in sequence or a recovered clock frequency fc is largely shifted from the reference clock frequency fr, there arise an out of lock or an error in data got with timing of the recovered clock CLK.

SUMMARY OF THE INVENTION

Accordingly, it is an object of the present invention to provide an error-suppressing phase comparator in which follow-up control of a recovered clock to a reference clock is improved.

In one aspect of the present invention, there is provided an error-suppressing phase comparator comprising: a phase comparator circuit for activating a first or second signal depending on lead or lag, respectively, of one directional edge of a clock recovered from serial data, relative to an edge of the serial data; an overrun detector circuit for activating an overrun signal when detecting that the lead or lag exceeds a predetermined amount; and a modification circuit for outputting the first and second signals as down and up signals, respectively, when the overrun signal is inactive, and outputting signals corresponding to the first and second signals as the up and down signals when the overrun signal is active.

After the phase error becomes zero, the phase error increases owing to a pulse train of the down or up signal. However, with the present invention, when the phase error exceeds the predetermined amount, the phase err decreases by the up or down signal from the modification circuit, therefore follow-up control of the recovered clock to a reference clock is improved as compared with a prior art case.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
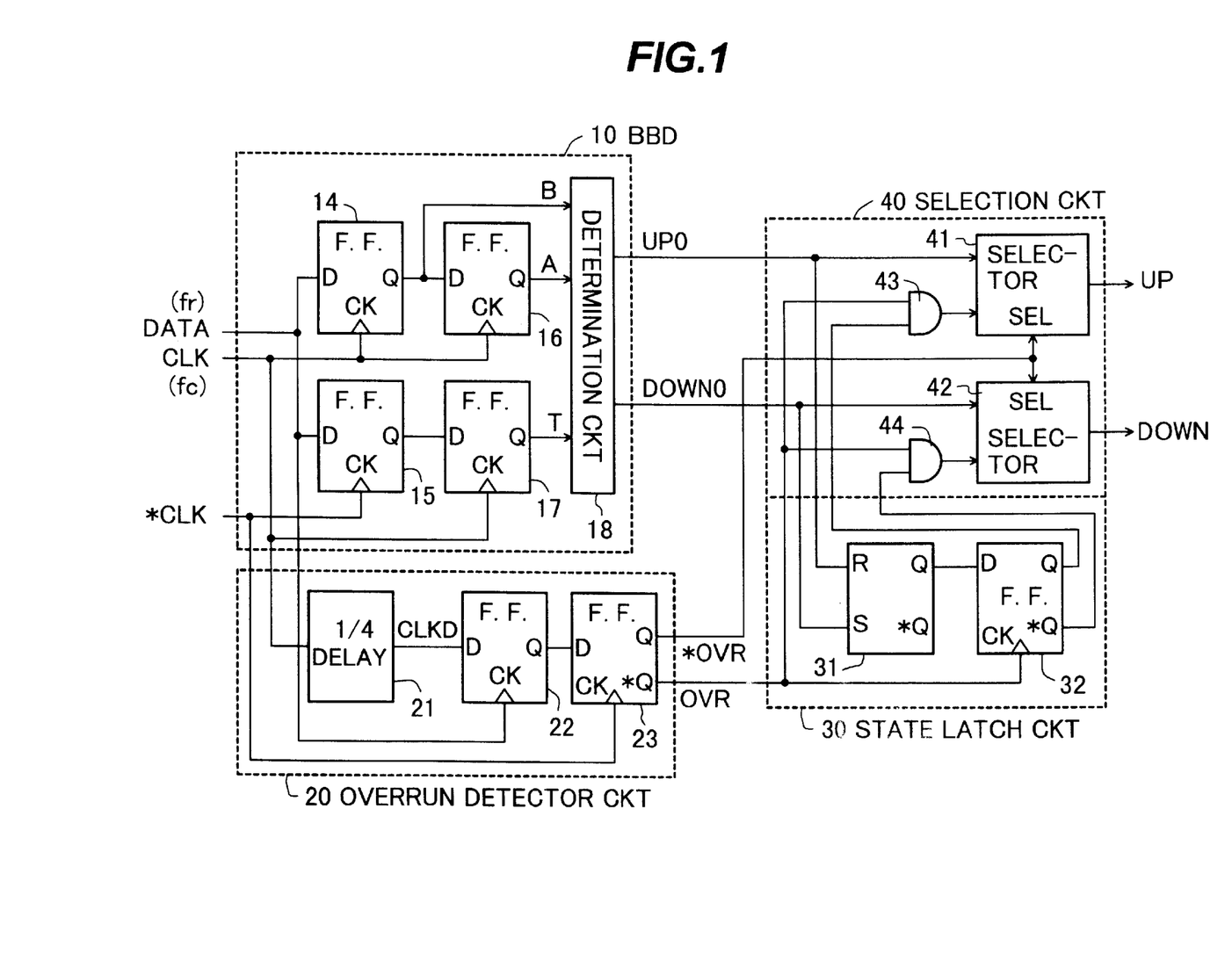
FIG. 1 is a block diagram showing an error-suppressing phase comparator of the first embodiment according to the present invention.

FIG. 1 shows an error-suppressing phase comparator of the first embodiment according to the present invention.

This circuit is provided with an overrun detector circuit 20, a state latch circuit 30 and a selection circuit 40 in addition to the phase comparator of FIG. 7.

The overrun detector circuit 20 works for keeping an overrun signal OVR in an active state while a lead or lag of an edge of the recovered clock CLK relative to the edge of DATA exceeds a predetermined amount. In the overrun detector circuit 20, the recovered clock CLK is delayed in a delay circuit 21 by one-fourth of a reference clock cycle T which is established on the transmission side, and the delayed one is provided to the data input D of a D flip-flop 22 as a clock CLKD. To the clock input CK of the D flip-flop 22, DATA is provided, and the delay clock CLKD is latched into the D flip-flop 22 in response to the rise of DATA. An output of the D flip-flop 22 is provided to the data input D of a D flip-flop 23. The D flip-flop 23 works for synchronizing the output signal of the D flip-flop 22 with the recovered clock in correspondence to the outputs of the phase comparator 10 being in synchronization with the recovered clock. The recovered clock *CLK complementary to CLK is provided to the clock input CK of the D flip-flop 23, and the output of the D flip-flop 22 is latched into the D flip-flop 23 in response to rise of *CLK. Overrun signals *OVR and OVR, which are complementary to each other, are respectively outputted from the non-inverting output Q and the inverted output *Q of the D flip-flop 23.

Figure 2A:
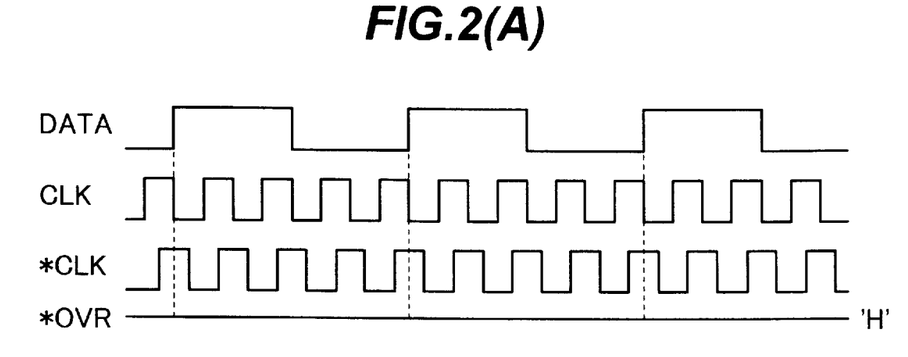
FIG. 2(A) is a timing chart showing operation of the overrun detector circuit of FIG. 1 in a case where falling edges of a recovered clock CLK are synchronized with edges of DATA.

FIG. 2(A) is a timing chart showing a case where falling edges of the recovered clock CLK are synchronized with edges of DATA (phase error is zero). DATA is recovered on rising edges of the recovered clock CLK and in FIG. 2(A), DATA is judged to be '011001100110.' Since the delay clock CLKD is high on the rising edges of DATA, the overrun signal *OVR keeps high. Even if the phase of the recovered clock CLK varies within $-\pi/2$ to $\pi/2$ relative to the edge of DATA from this state, that is, when phase error is relatively small, the overrun signal *OVR maintains high.

Figure 2B:
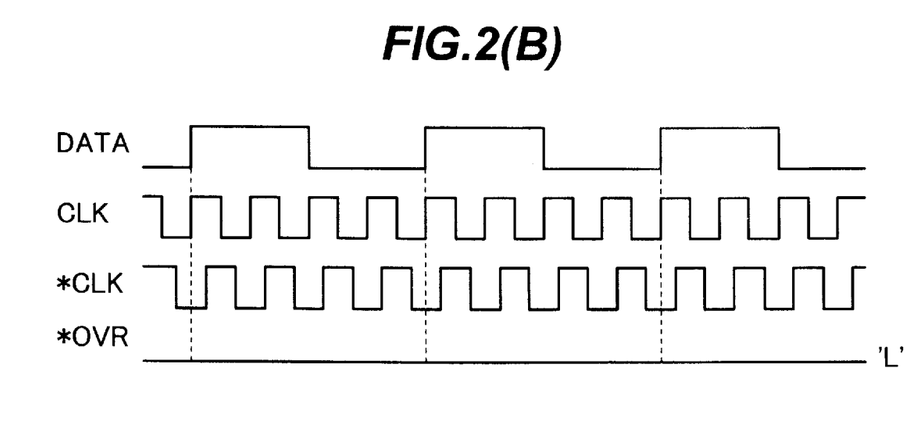
FIG. 2(B) is a timing chart showing operation of the overrun detector circuit in a case where falling edges of the recovered clock CLK lag (or lead) edges of DATA by $\pi$.

FIG. 2(B) is a timing chart showing a case where the falling edge of the recovered clock CLK lags (or leads) the edge of DATA by $\pi$. In this case, since the delay clock CLKD is low on the rise of DATA, the overrun signal *OVR maintains low. Even if the falling edge of the recovered clock CLK varies within $-\pi/2$ to $\pi/2$ relative to the edge of DATA from this state, that is, when phase error is smaller than $-\pi/2$ or larger than $\pi/2$, the overrun signal *OVR maintains low.

Referring back to FIG. 1, the state latch circuit 30 works for latching the state of an up signal UPO and a down signal DOWN0, which are outputs of the phase comparator 10, at a time when either the up signal UP0 or the down signal DOWN0 is active, prior to activation of the signal OVR. In the state latch circuit 30, the signals UP0 and DOWN0 are respectively provided to the reset input R and set input S of an RS flip-flop 31, and the non-inverting output Q of the RS flip-flop 31 is connected to the data input D of a D flip-flop 32. To the clock input CK of the D flip-flop 32, the signal OVR is provided. The D flip-flop 32 works for latching, when the signal OVR goes high, an output of the D flip-flop 31 set by the activation of the signal DOWN0 and reset by the activation of the signal UP0.

In the selection circuit 40, the overrun signal *OVR is provided to the selection control inputs SEL of selectors 41 and 42. The signals UP0 and DOWN0 from the phase comparator 10 are respectively provided to one data inputs of the selectors 41 and 42. The outputs of AND gates 43 and 44 are respectively provided to the other data inputs of the selectors 41 and 42. The signal OVR is provided to one inputs of the AND gates 43 and 44, and the outputs Q and *Q of the D flip-flop 32 are respectively provided to the other inputs thereof. The selection circuit 40 outputs the signals UP0 and DOWN0 from the phase comparator 10 as signals UP and DOWN, respectively, through the selectors 41 and 42 when the overrun signal *OVR is high, while outputting the outputs of the AND gates 43 and 44 as the signal UP and DOWN, respectively, when the overrun signal *OVR is low.

Figure 3:
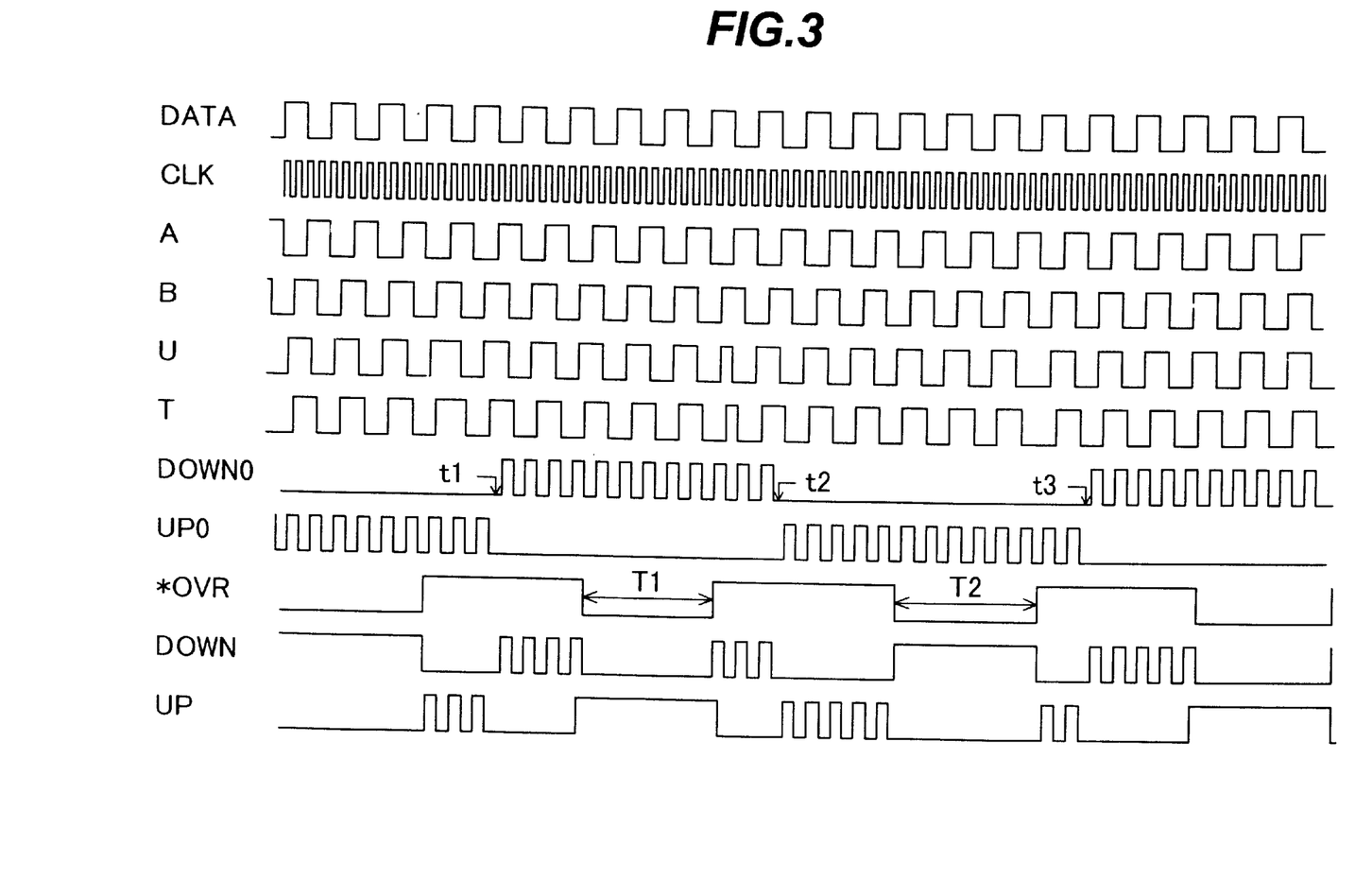
FIG. 3 is a timing chart showing operation of the circuit of FIG. 1.

FIG. 3 is a timing chart showing operation of the circuit of FIG. 1.

In FIG. 3, the falling edges of the recovered clock CLK coincide with the edges of DATA at time points t1, t2 and t3 where pulse trains of the signals DOWN0 and UP0 switch over to each other. Phase errors near the time points t1, t2 and t3 are relatively small and the overrun signal *OVR is high. When the overrun signal *OVR is high, the signals UP0 and DOWN0 from the phase comparator 10 are respectively outputted as the signals UP and DOWN from the selection circuit 40.

In the time periods between the time points t1 and t2 and between the time points t2 and t3, there are time periods T1 and T2 in which the absolute value of phase error is larger than $\pi/2$ and in which the overrun signal *OVR is low and the outputs of the AND gates 43 and 44 are respectively outputted as the signals UP and DOWN from the selection circuit 40. That is, since the pulse train of the signal DOWN0 was outputted from the phase comparator 10 prior to the starting of the time period T1, the signal UP is high in the time period T1. Likewise, since the pulse train of the signal UP0 was outputted from the phase comparator 10 prior to the starting of the time period T2, the signal DOWN is high in the time period T2.

The phase error of the recovered clock CLK is zero at the time point t1 and after that, the phase lags by the pulse train of the signal DOWN and the phase error accumulates, but the phase shift is reversed into the direction of phase lead by the signal UP that is high in the time period T1. Therefore the maximum phase error value is reduced to about a half of a prior art one, improving the follow-up control of the recovered clock CLK to the reference clock as compared with a prior art case. Likewise, the phase error is zero at the time point T2 and after that, the phase leads by the pulse train of the signal UP and the phase error accumulates, but the phase shift is reversed into the direction of phase lag by the signal DOWN that is high in the time period T2. Therefore the maximum phase error is reduced to about a half of the prior art one, improving the follow-up control of the recovered clock CLK to the reference clock as compared with the prior art case.

Therefore, when a PLL circuit employs the error-suppressing phase comparator of FIG. 1, it is prevented from occurring that the recovered clock frequency fc is largely deviated from the reference clock frequency fr, which prevents occurrence of error of data recovered using the clock CLK.

Figure 4A:
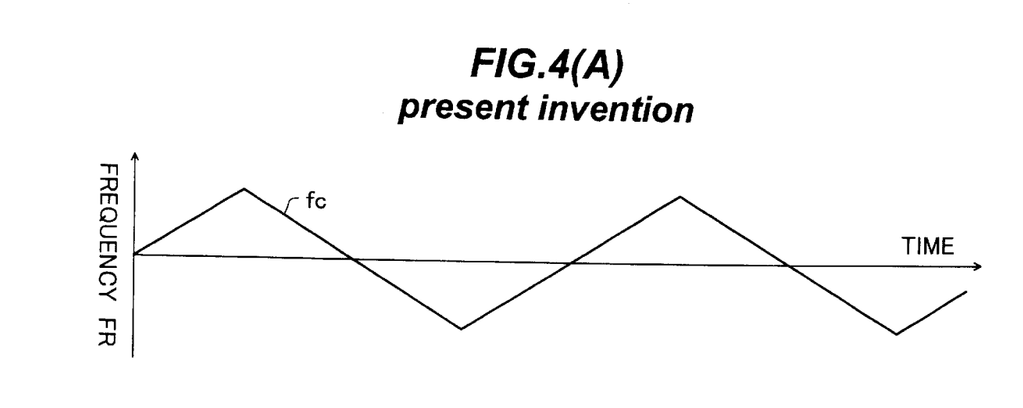
FIG. 4(A) is a schematic diagram showing the changes of a recovered clock frequency fc with time in a PLL circuit using the error-suppressing phase comparator of FIG. 1.
Figure 4B:
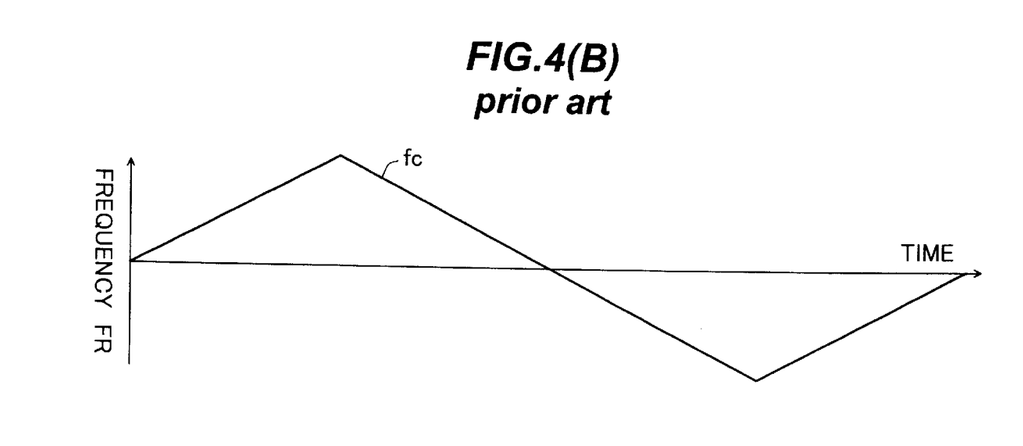
FIG. 4(B) is a schematic diagram showing the changes of a recovered clock frequency fc with time in a PLL circuit using a prior art phase comparator.

FIG. 4(A) shows the changes of a recovered clock frequency fc in a PLL circuit using the error-suppressing phase comparator of FIG. 1, and FIG. 4(B) shows the changes of a recovered clock frequency fc in a PLL circuit using the prior art phase comparator 10 of FIG. 6.

Second Embodiment

Figure 5:
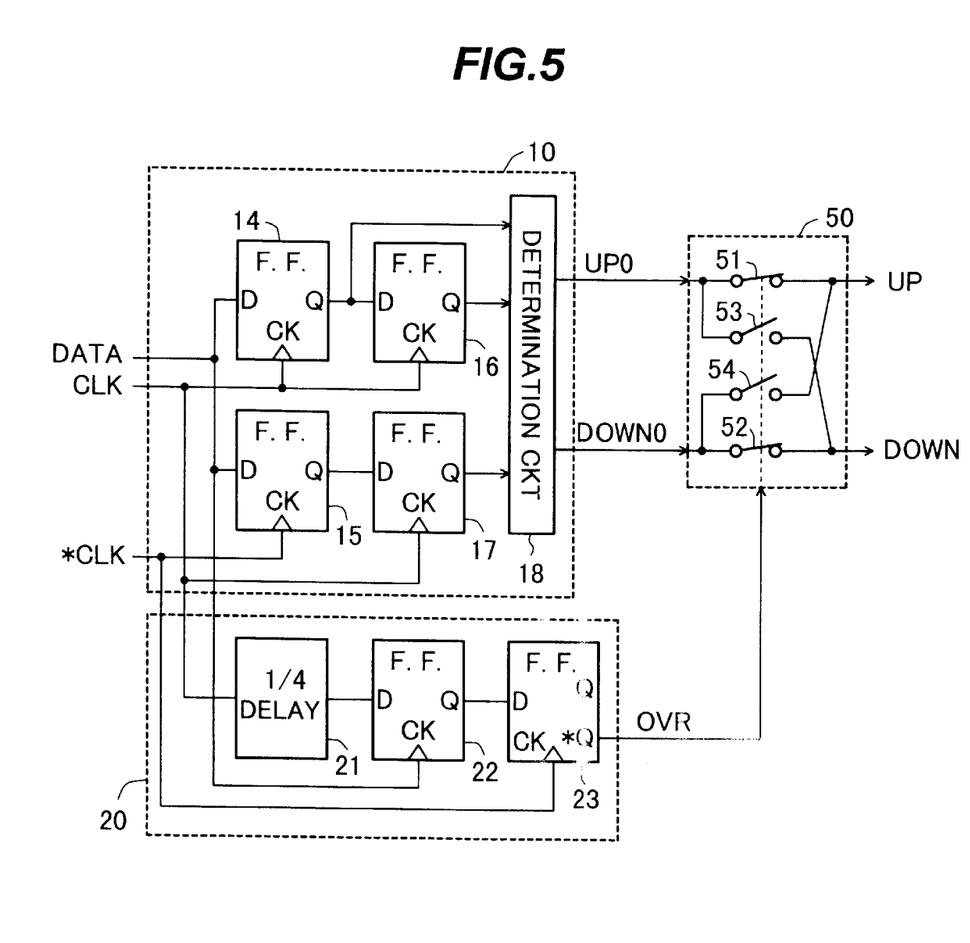
FIG. 5 is a block diagram showing an error-suppressing phase comparator of the second embodiment according to the present invention.

FIG. 5 shows an error-suppressing phase comparator of the second embodiment according to the present invention.

In this circuit, a switching circuit 50 is employed instead of the state latch circuit 30 and the selection circuit 40 of FIG. 1. Signals UP0 and DOWN0 from the phase comparator 10 are provided to the data inputs of the switching circuit 50, and the signal OVR from the overrun detector circuit 20 is provided to the control input thereof. When the signal OVR is low, namely phase error is small, switching elements 51 and 52 of the switching circuit 50 are on and switching elements 53 and 54 are off, and the signals UP0 and DOWN0 are outputted as the signals UP and DOWN from the switching circuit 50. In the time period when the signal OVR is high, conversely the switching elements 51 and 52 are off and the switching elements 53 and 54 are on, and the signals UP0 and DOWN0 from the phase comparator 10 are respectively outputted as the signals DOWN and UP from the switching circuit 50.

Operation of the circuit of FIG. 5 is such that the pulses of relatively large width in the signals UP and DOWN in FIG. 3 are replaced with the corresponding pulse trains of the signals DOWN0 and UP0. Hence, operation similar to in the case of the first embodiment is performed in the second embodiment as well.

According to the error-suppressing phase comparator of the second embodiment, the configuration can be simpler than the first embodiment.

Although preferred embodiments of the present invention has been described, it is to be understood that the invention is not limited thereto and that various changes and modifications may be made without departing from the spirit and scope of the invention.

For example, the phase comparator (10) employed in the present invention is not limited to the BBD of FIG. 1, but various kinds thereof can be employed. The amount of delay time of the circuit 21 may be about $\pi/2$ or about $(3/2)\pi$. In the case of about $(3/2)\pi$, the overrun signals OVR and *OVR are respectively generated from the outputs Q and *Q of the D flip-flop 23, which are in reverse of the above description.

Further, a configuration is allowed in which the output of the D flip-flop 22 is provided to the clock input CK of the D flip-flop 32 and to the selection control inputs SEL of the selectors 41 and 42, without using the D flip-flop 23. In addition, a configuration is allowed in which the signals OVR and *OVR are directly provided to the other data inputs of the selectors 41 and 42 respectively without using the RS flip-flop 31 and the D flip-flop 32. Furthermore, in FIG. 5, a pulse train of the signal UP or DOWN may be converted to a single pulse with a large width while the signal OVR is high.

The directions of edges, namely rising/falling, at which phases are compared with each other may be in reverse of the above description.

Also in the PLL circuit including the error-suppressing phase comparator, between the VCO output and the recovered clock input of the phase comparator, a frequency multiplier multiplying an input clock frequency by m (a natural number) or/and a frequency divider dividing an input clock frequency by n (a natural number) may be connected so that the clock frequency of the VCO output is equal to 1/m, n or n/m times that of the recovered clock.

What is claimed is:

1. An error-suppressing phase comparator comprising:
   a phase comparator circuit for activating a first or second signal depending on lead or lag, respectively, of one directional edge of a clock recovered from serial data, relative to an edge of said serial data;
   an overrun detector circuit for activating an overrun signal when detecting that said lead or lag exceeds a predetermined amount; and
   a modification circuit for outputting said first and second signals as down and up signals, respectively, when said overrun signal is inactive, and outputting signals corresponding to said first and second signals as said up and down signals when said overrun signal is active.

2. An error-suppressing phase comparator according to claim 1, wherein said modification circuit comprises:
   a state latch circuit for latching a state of said first and second signals at a time when said overrun signal is inactive but one of said first and second signals is active; and
   a selection circuit for outputting said first and second signals as said down and up signals, respectively, when said overrun signal is inactive, and for outputting said first and second signals as said up and down signals, respectively, when said overrun signal is active.

3. An error-suppressing phase comparator according to claim 2, wherein said state latch circuit comprises:
   an RS flip-flop circuit having set and reset inputs to receive said first and second signals, respectively.

4. An error-suppressing phase comparator according to claim 3, wherein said state latch circuit further comprises:
   a flip-flop for latching an output of said RS flip-flop in response to activation of said overrun signal.

5. An error-suppressing phase comparator according to claim 1, wherein said modification circuit is a switching circuit for outputting said first and second signals as said down and up signals when said overrun signal is inactive, and for outputting said first and second signals as said up and down signals when said overrun signal is active.

6. An error-suppressing phase comparator according to claim 1, wherein said overrun detector circuit comprises:
   a delay circuit for delaying said recovered clock; and
   a flip-flop for latching an output of said delay circuit in response to an edge of said serial data, and for outputting its latched data as a signal associated with said overrun signal.

7. An error-suppressing phase comparator according to claim 6, wherein said overrun detector circuit further comprises:
   a flip-flop for latching said latched data in response to an edge of said recovered clock, and for outputting its latched data as said overrun signal.

8. An error-suppressing phase comparator according to claims 1, wherein said phase comparator circuit is a Bang Bang phase detector circuit.

9. A PLL circuit, for reproducing a clock from serial data, comprising an error-suppressing phase comparator for generating up and down signals for increasing and decreasing a frequency of said recovered clock, respectively,
   wherein said error-suppressing phase comparator comprises:
      a phase comparator circuit for activating a first or second signal depending on lead or lag, respectively, of one directional edge of said recovered clock, relative to an edge of said serial data;
      an overrun detector circuit for activating an overrun signal when detecting that said lead or lag exceeds a predetermined amount; and
      a modification circuit for outputting said first and second signals as said down and up signals, respectively, when said overrun signal is inactive, and outputting signals corresponding to said first and second signals as said up and down signals when said overrun signal is active.

10. A PLL circuit according to claim 9 further comprising:
   a charge pump, for providing a pulse of a current signal depending on a pulse of said up signal or said down signal;
   a loop filter for receiving said current signal from said charge pump and providing a filtered voltage; and
   a voltage controlled oscillator for generating said recovered clock with a frequency depending on said filtered voltage.

* * * * *